US006664167B2

(12) United States Patent
Temmler et al.

(10) Patent No.: US 6,664,167 B2
(45) Date of Patent: Dec. 16, 2003

(54) MEMORY WITH TRENCH CAPACITOR AND SELECTION TRANSISTOR AND METHOD FOR FABRICATING IT

(75) Inventors: Dietmar Temmler, Dresden (DE); Herbert Benzinger, München (DE); Wolfram Karcher, Langebrück (DE); Catharina Pusch, München (DE); Martin Schrems, Eggersdorf (AT); Jürgen Faul, Radebeul (DE)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 10/085,940

(22) Filed: Feb. 28, 2002

(65) Prior Publication Data

US 2002/0137278 A1 Sep. 26, 2002

Related U.S. Application Data

(63) Continuation of application No. PCT/DE00/02866, filed on Aug. 23, 2000.

(30) Foreign Application Priority Data

Aug. 30, 1999 (DE) .......................................... 199 41 148

(51) Int. Cl.[7] .............................................. H01L 21/20
(52) U.S. Cl. ...................... 438/386; 438/243; 438/387; 438/294; 438/299; 438/300; 257/346; 257/396
(58) Field of Search ............................ 438/386–7, 243, 438/294–300; 257/346, 396

(56) References Cited

U.S. PATENT DOCUMENTS

| 4,074,302 A | * | 2/1978 | Brewer ........................ 257/216 |
| 4,649,625 A | | 3/1987 | Lu |
| 4,820,652 A | * | 4/1989 | Hayashi ...................... 438/249 |

(List continued on next page.)

FOREIGN PATENT DOCUMENTS

| EP | 0 262 294 A1 | 4/1988 |
| JP | 10-321813 | 12/1998 |

OTHER PUBLICATIONS

N.C.C. Lu et al.: "A Buried–Trench DRAM Cell Using A Self–Aligned Epitaxy Over Trench Technology", 1988International Electron Devices Meeting Technical Digest, pp. 588–591.

G.B. Bronner et al.: "Epitaxy Over Trench Technology for ULSI DRAMs", Symposium on VLSI Technology, 1988, Dig. Techn. Papers, pp. 21–22.

Anonymous: "Method For Making A Dynamic Random–Access Memory Cell", IBM Technical Disclosure Bulletin, vol. 32, No. 4A, Sep. 1989, pp. 398–399.

Frank S. Becker et al.: "Low Pressure Deposition of Doped $SiO_2$ by Pyrolysis of Tetraethylorthosilicate (TEOS)", J. Electrochem. Soc., vol. 136, No. 10, Oct. 1989, pp. 3033–3043.

C.M. Ransom et al.: "Shallow $n^+$ Junctions in Silicon by Arsenic Gas–Phase Doping", J. Electrochem. Soc., vol. 141, No. 5, May 1994, pp. 1378–1381.

*Primary Examiner*—Matthew Smith
*Assistant Examiner*—Granvill D Lee
(74) *Attorney, Agent, or Firm*—Laurence A. Greenberg; Werner H. Stemer; Ralph E. Locher

(57) ABSTRACT

A memory having a memory cell formed in a substrate and including a trench capacitor and a transistor and a method for producing the memory includes connecting the trench capacitor to the transistor with a self-aligned connection. The transistor at least partly covers the trench capacitor. The trench capacitor is filled with a conductive trench filling and an insulating covering layer is situated on the conductive trench filling. An epitaxial layer is situated above the insulating covering layer. The transistor is formed in the epitaxial layer. The self-aligned connection is formed in a contact trench and includes an insulation collar in which a conductive material is introduced. A conductive cap is formed on the conductive material.

24 Claims, 8 Drawing Sheets

U.S. PATENT DOCUMENTS

| | | | |
|---|---|---|---|
| 4,907,047 A | * 3/1990 | Kato et al. | 257/297 |
| 4,937,205 A | 6/1990 | Nakayama et al. | |
| 5,055,898 A | 10/1991 | Beilstein, Jr. et al. | |
| 5,065,273 A | 11/1991 | Rajeevakumar | |
| 5,250,829 A | 10/1993 | Bronner et al. | |
| 5,336,629 A | 8/1994 | Dhong et al. | |
| 5,344,381 A | 9/1994 | Cabrera y Lopez Caram | |
| 5,410,503 A | 4/1995 | Anzai | |
| 5,512,767 A | 4/1996 | Noble, Jr. | |
| 5,641,694 A | 6/1997 | Kenney | |
| 5,658,816 A | 8/1997 | Rajeevakumar | |
| 5,691,549 A | 11/1997 | Lam et al. | |
| 5,712,202 A | * 1/1998 | Liaw et al. | 438/253 |
| 5,736,760 A | 4/1998 | Hieda et al. | |
| 5,744,386 A | 4/1998 | Kenney | |
| 5,770,484 A | * 6/1998 | Kleinhenz | 438/155 |
| 5,780,335 A | * 7/1998 | Henkels et al. | 438/243 |
| 5,830,797 A | * 11/1998 | Cleeves | 438/296 |
| 5,831,899 A | * 11/1998 | Wang et al. | 365/156 |
| 5,843,820 A | 12/1998 | Lu | |
| 5,869,868 A | 2/1999 | Rajeevakumar | |
| 5,893,735 A | 4/1999 | Stengl et al. | |
| 5,909,044 A | 6/1999 | Chakravarti et al. | |
| 5,998,254 A | * 12/1999 | Heineck | 438/243 |
| 5,998,821 A | 12/1999 | Hieda et al. | |
| 6,031,262 A | * 2/2000 | Sakao | 257/306 |
| 6,236,079 B1 | * 5/2001 | Nitayama et al. | 257/306 |

* cited by examiner

MEMORY WITH TRENCH CAPACITOR AND SELECTION TRANSISTOR AND METHOD FOR FABRICATING IT

CROSS-REFERENCE TO RELATED APPLICATION

This application is a continuation of copending International Application No. PCT/DE00/02866, filed Aug. 23, 2000, which designated the United States.

BACKGROUND OF THE INVENTION

Field of the Invention

The invention relates to a trench capacitor with a selection transistor and a corresponding fabrication method. The invention is explained with regard to a trench capacitor that is used in a DRAM memory cell. For discussion purposes, the invention is described in respect of the formation of an individual memory cell.

Integrated circuits (ICs) or chips contain capacitors for the purpose of storing charge, such as, for example, a dynamic random access memory (DRAM). In such a case, the charge state in the capacitor represents a data bit.

A DRAM chip contains a matrix of memory cells that are disposed in the form of rows and columns and are addressed by word lines and bit lines. The reading of data from the memory cells or the writing of data to the memory cells is realized by activating suitable word lines and bit lines.

A DRAM memory cell usually contains a transistor connected to a capacitor. The transistor includes, inter alia, two diffusion regions isolated from one another by a channel that is controlled by a gate. Depending on the direction of current flow, one diffusion region is referred to as the drain and the other as the source. The source region is connected to a bit line, the drain region is connected to the trench capacitor and the gate is connected to a word line. By the application of suitable voltages to the gate, the transistor is controlled such that a current flow between the drain region and the source region through the channel is switched on and off.

The charge stored in the capacitor decreases over time on account of leakage currents. Before the charge has decreased to a level below a threshold value, the storage capacitor must be refreshed. For this reason, these memories are referred to as dynamic RAM (DRAM).

The central problem in prior art DRAM variants based on a trench capacitor is the production of a sufficiently large capacitance for the trench capacitor. The problem will be aggravated in future by the advancing miniaturization of semiconductor components. The increase in the integration density means that the area available per memory cell and, thus, the capacitance of the trench capacitor decrease ever further.

Sense amplifiers require a sufficient signal level for reliably reading out the information situated in the memory cell. The ratio of the storage capacitance to the bit line capacitance is crucial in determining the signal level. If the storage capacitance is too low, the ratio may be too small for generating an adequate signal.

A lower storage capacitance likewise requires a higher refresh frequency, because the quantity of charge stored in the trench capacitor is limited by its capacitance and additionally decreases due to leakage currents. If the quantity of charge falls below a minimum quantity of charge in the storage capacitor, then it is no longer possible for the information stored therein to be read out by the connected sense amplifiers, the information is lost, and read errors arise.

One way of avoiding read errors is to reduce the leakage currents. Leakage currents can be reduced on the one hand by transistors and on the other hand by dielectrics, such as the capacitor dielectric, for example. An undesirably reduced retention time can be lengthened by these measures.

Stacked capacitors or trench capacitors are usually used in DRAMs. Examples of DRAM memory cells having a trench capacitor are given in U.S. Pat. No. 4,649,625 to Lu, U.S. Pat. No. 5,065,273 to Rajeevakumar, U.S. Pat. No. 5,512,767 to Noble, Jr., U.S. Pat. No. 5,641,694 to Kenney, U.S. Pat. No. 5,658,816 to Rajeevakumar, U.S. Pat. No. 5,691,549 to Lam et al., U.S. Pat. No. 5,736,760 to Hieda et al., U.S. Pat. No. 5,744,386 to Kenney, and U.S. Pat. No. 5,869,868 to Rajeevakumar.

A trench capacitor has a three-dimensional structure that is formed in a silicon substrate, for example. An increase in the capacitor electrode area and, thus, in the capacitance of the trench capacitor can be achieved, for example, by etching more deeply into the substrate and, thus, by deeper trenches. In such a case, the increase in the capacitance of the trench capacitor does not cause the substrate surface occupied by the memory cell to be enlarged. However, this method is also limited because the attainable etching depth of the trench capacitor depends on the trench diameter, and, during fabrication, it is only possible to attain specific, finite aspect ratios between the trench depth and trench diameter.

As the increase in the integration density advances, the substrate surface available per memory cell decreases ever further. The associated reduction in the trench diameter leads to a reduction in the capacitance of the trench capacitor. If the capacitance of the trench capacitor is dimensioned to be so low that the charge that can be stored is insufficient for entirely satisfactory readout by the sense amplifiers connected downstream, then read errors result.

The problem is solved, for example, in the publication N.C.C. Lou, IEDM 1988, page 588 et seq., by moving the transistor, which is usually situated next to the trench capacitor, to a position situated above the trench capacitor. As a result, the trench can take up a part of the substrate surface that is conventionally reserved for the transistor. Through such a configuration, the trench capacitor and the transistor share part of the substrate surface. The configuration is made possible by growing an epitaxial layer above the trench capacitor.

What is problematic, however, is the electrical connection of the trench capacitor to the transistor. To that end, N.C.C. Lou, TEDM 1988, page 588 et seq., describes a method in which lithographic alignment of the individual lithographic planes with respect to one another requires a minimum distance between trench capacitor and transistor. As a result, the memory cells in a memory cell array require a relatively large area and are unsuitable for integration in a large-scale integrated cell array.

Furthermore, Japanese Patent Document 10-321813 A, corresponding to U.S. Pat. No. 5,998,821 to Hieda et al., discloses a DRAM memory cell in which the selection transistor is situated in a subsequently grown, epitaxial silicon layer directly above the trench capacitor. A so-called "surface strap" diffusion layer 35 is provided to electrically connect the inner capacitor electrode 25 to the source/drain regions 34.

Furthermore, U.S. Pat. No. 5,843,820 to Lu discloses a DRAM memory cell in which the selection transistor is situated in a subsequently grown, epitaxial silicon layer above a horizontal trench capacitor.

However, U.S. Pat. No. 5,410,503 to Anzai discloses a memory cell having a selection transistor and a trench capacitor. In such a case, the selection transistor is disposed in a subsequently grown, epitaxial silicon layer and horizontally adjoins the trench capacitor, so that the source electrode is electrically conductively connected to the outer capacitor electrode.

SUMMARY OF THE INVENTION

It is accordingly an object of the invention to provide a memory with trench capacitor and selection transistor and method for fabricating it that overcomes the hereinafore-mentioned disadvantages of the heretofore-known devices and methods of this general type and that electrically connects the trench capacitor to the transistor in a way that is suitable for a large scale integrated cell array.

With the foregoing and other objects in view, there is provided, in accordance with the invention, a semiconductor memory, including a substrate and at least two memory cells. Each of the memory cells is disposed at least partly in the substrate. Each of the memory cells has a transistor having a drain region, a source region, and a channel, a first word line disposed between the source region and the drain region, a trench capacitor having an inner electrode, an outer electrode, and a dielectric layer disposed between the inner electrode and the outer electrode, a trench disposed in the substrate and filled with a conductive trench filling forming the inner electrode of the trench capacitor, an insulating covering layer disposed on the conductive trench filling, an epitaxial layer disposed on the substrate and at least partly on the insulating covering layer, the source region, the drain region, and the channel of the transistor disposed in the epitaxial layer, a trench isolation disposed in the substrate and in the epitaxial layer, the trench isolation insulating adjacent ones of the memory cells from one another, the trench isolation respectively extending into the inner electrode of each of two adjacent ones of the memory cells, the first word line disposed on the epitaxial layer and partly covering the trench, a first insulation encapsulation surrounding the first word line, a second word line disposed on the trench isolation, second insulation encapsulation surrounding the second word line, a contact trench having a self-aligned connection electrically connecting the conductive trench filling to the drain region, the contact trench disposed between the first word line with the first insulation encapsulation and the second word line with the second insulation encapsulation, and the trench isolation bounding the contact trench.

The idea on which the invention is based lies in the use of a self-aligned connection that electrically connects the trench capacitor to the transistor. In such a case, structures that are already present on a substrate are used for forming the self-aligned connection.

In accordance with another feature of the invention, the contact trench has a lower region and an insulation collar is disposed in the lower region.

In accordance with a further feature of the invention, the word lines with their insulation encapsulations are used as an etching mask for the formation of a contact trench. The self-aligned connection can subsequently be formed in the contact trench.

In accordance with an added feature of the invention, the trench isolation (STI) is used as an etching mask for the formation of a contact trench, in which the self-aligned connection is subsequently formed.

In accordance with an additional feature of the invention, there is provided an insulation collar situated in the lower region of the contact trench.

In accordance with yet another feature of the invention, there is provided a conductive material disposed on the conductive trench filling.

In accordance with yet a further feature of the invention, there is provided a conductive material disposed in the insulation collar, in the contact trench, and on the conductive trench filling.

In accordance with yet an added feature of the invention, there is provided a conductive material that contributes to the electrical connection between trench capacitor and transistor situated in the contact trench.

In accordance with yet an additional feature of the invention, there is provided a conductive cap disposed on the conductive material in the contact trench.

In accordance with again another feature of the invention, there is provided a conductive cap that likewise contributes to the electrical connection between trench capacitor and transistor is situated on the conductive material in the contact trench.

In accordance with again a further feature of the invention, the insulation collar extends from the insulating covering layer at least as far as the drain region, and the conductive material and the conductive cap are not directly connected to the substrate or to the epitaxial layer. As a result, the conductive material and the conductive cap are insulated to reduce leakage currents that could discharge the trench capacitor.

In accordance with again an added feature of the invention, the trench isolation reaches at least down to the depth of the insulating covering layer.

In accordance with again an additional feature of the invention, the trench isolation extends deeper into the substrate than a depth of the insulating covering layer.

With the objects of the invention in view, there is also provided a method for forming a semiconductor memory having a trench, and memory cells each having a transistor with a drain region, a source region, and a channel, a first word line disposed between the source region and the drain region, and a trench capacitor having an inner electrode, an outer electrode, and a dielectric layer disposed between the inner electrode and the outer electrode, includes the steps of providing a substrate with a trench, filling the trench with a conductive trench filling to form the inner electrode of the trench capacitor, forming an insulating covering layer on the conductive trench filling, growing an epitaxial layer on the surface of the substrate and partly covering the insulating covering layer with the epitaxial layer, forming a trench isolation at least in the epitaxial layer to insulate adjacent memory cells from one another, forming the first word line above the epitaxial layer, forming a second word line above the trench isolation, surrounding the first word line a first insulation encapsulation, surrounding the second word line a second insulation encapsulation, defining the source region and the drain region of the transistor in the epitaxial layer, etching a contact trench through the epitaxial layer and the insulating covering layer as far as the conductive trench filling utilizing the first word line with the first insulation encapsulation and the second word line with the second insulation encapsulation as an etching mask for the etching of the contact trench, and forming a self-aligned connection in the contact trench to electrically connect the conductive trench filling to the drain region.

In accordance with still another mode of the invention, the contact trench is formed in a self-aligned manner between the first and second word lines. This means that the first and second word lines with their first and second insulation encapsulations, respectively, are used as an etching mask for the formation of the contact trench.

In accordance with still a further mode of the invention, the trench isolation is formed as an etching mask for the formation of the contact trench.

In accordance with still an added mode of the invention, an insulation collar is advantageously formed in the contact trench. Furthermore, at least one conductive material that contributes to the electrical connection between trench capacitor and transistor is introduced in the contact trench.

In accordance with still an additional mode of the invention, a conductive cap that likewise contributes to the electrical connection is formed above the conductive material and above the insulation collar.

In accordance with another mode of the invention, the insulation collar is advantageously formed such that the conductive material and the conductive cap are electrically connected to the epitaxial layer only through the drain region. The configuration reduces leakage currents that can discharge the trench capacitor.

In accordance with a further mode of the invention, the epitaxial layer is doped in situ. As a result, the channel doping of the transistor and the well doping can be set as early as during the growth of the epitaxial layer. Furthermore, the formation of doping profiles with very steep slopes is made possible, which lead to small leakage currents and make the components scaleable.

In accordance with an added mode of the invention, an epitaxial closing joint is formed in the epitaxial layer, which is at least partly removed through the trench isolation and/or through the contact trench. Moreover, it is advantageous to orient the layout of the trench to a crystal orientation of the substrate such that the epitaxial closing joint becomes as small as possible.

In accordance with an additional mode of the invention, the insulating covering layer is formed before the removal of a hard mask that has been used to pattern the trench. As a result, it is possible to form the insulating covering layer selectively in the trench on the conductive trench filling.

In accordance with yet another mode of the invention, a temperature step is carried out after growing the epitaxial layer.

In accordance with yet a further mode of the invention, the epitaxial layer is annealed after growing the epitaxial layer.

It is advantageous to treat the epitaxial layer with a thermal step that reduces the defects in the epitaxial layer and anneals the epitaxial closing joint. In such a case, the crystal structure of the epitaxial closing joint is as far as possible completely reconstructed.

In accordance with yet an added mode of the invention, the epitaxial layer is planarized after growing the epitaxial layer. It is advantageous to treat the epitaxial layer with a planarization step that smoothes and partly etches back the surface of the epitaxial layer.

In accordance with a concomitant feature of the invention, the word lines and their insulation encapsulations are formed as lateral edge webs (spacers) on the sidewalls of the trench isolation. The configuration has the advantage that the word lines can have a width that lies below the smallest lithography dimension F.

Other features that are considered as characteristic for the invention are set forth in the appended claims.

Although the invention is illustrated and described herein as embodied in a memory with trench capacitor and selection transistor and method for fabricating it, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures, identical reference symbols designate identical or functionally identical elements.

Figure 1:
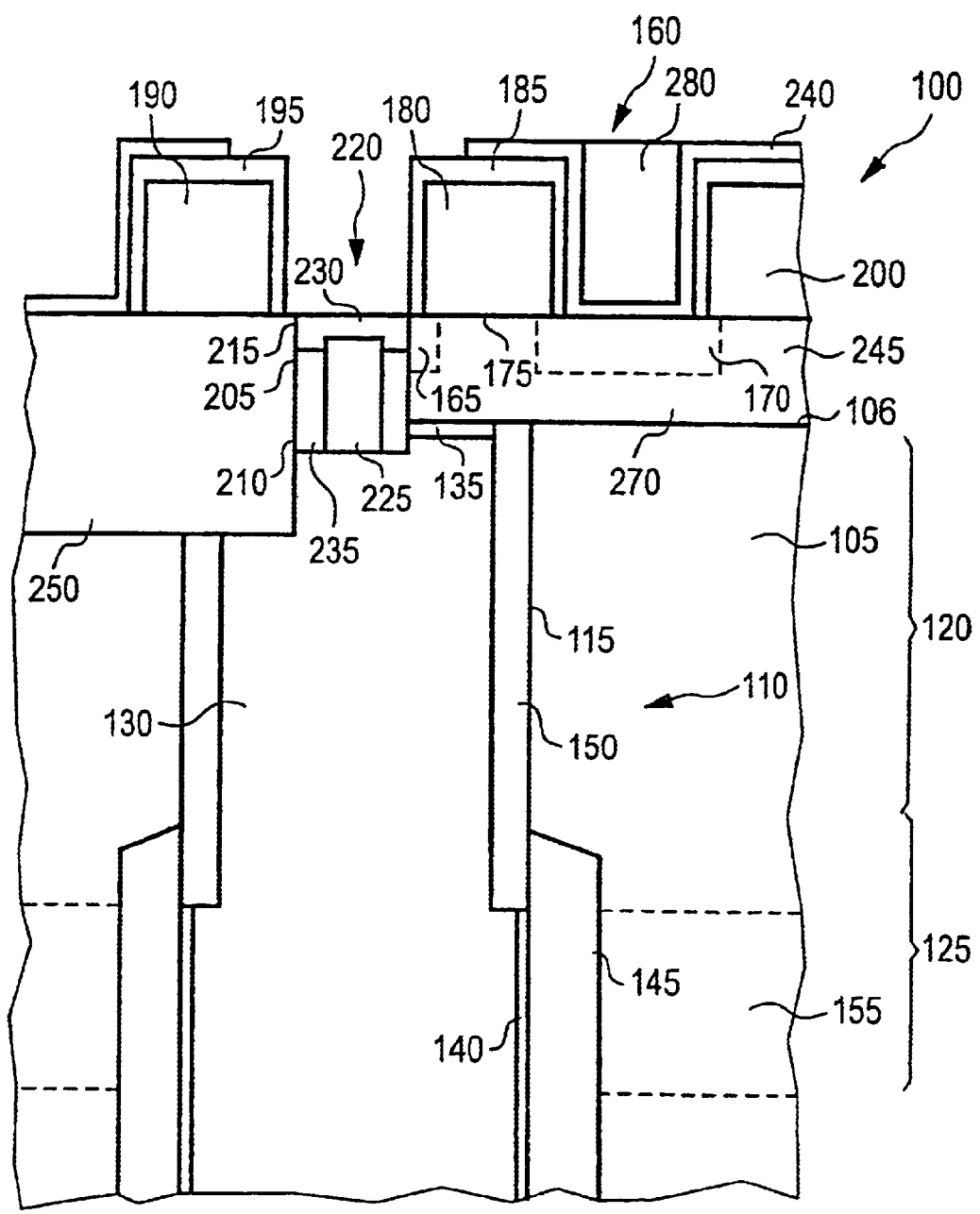
FIG. 1 is a fragmentary, cross-sectional view of a first embodiment of a DRAM memory cell according to the invention.

Referring now to the figures of the drawings in detail and first, particularly to FIG. 1 thereof, there is shown a first embodiment of the invention with a memory cell 100 having a trench capacitor 110 and a transistor 160. The trench capacitor 110 is formed in a substrate 105 having a surface 106. A buried well 155, which is composed of n-doped silicon, for example, is introduced in the substrate 105, which is composed of p-doped silicon, for example. Boron, arsenic, or phosphorus are suitable dopants for doping silicon. The trench capacitor 110 has a trench 115 with an upper region 120 and a lower region 125. A large insulation collar 150 is situated in the upper region 120 of the trench 115. The lower region 125 of the trench at least partly penetrates the buried well 155. A buried plate 145 is disposed around the lower region 125 of the trench 115, which plate 145 forms the outer capacitor electrode of the trench capacitor 110. The buried plates of the adjacent memory cells are electrically connected to one another by the buried well 155. The buried plate 145 is composed of n-doped silicon, for example.

The lower region 125 of the trench 115 is lined with a dielectric layer 140, which forms the storage dielectric of the trench capacitor 110. The dielectric layer 140 may be fabricated from layers or layer stacks including silicon oxide, silicon nitride, or silicon oxynitride. It is also possible to use storage dielectrics that have a high dielectric constant, such as, for example, tantalum oxide, titanium oxide, BST (barium strontium titanate), and any other suitable dielectric.

The trench 115 is filled with a conductive trench filling 130, which forms the inner capacitor electrode and is composed of doped polysilicon, for example. An insulating cover layer 135, which is composed of silicon oxide, for example, is situated above the conductive trench filling 130. Furthermore, a self-aligned connection 220 is situated above the conductive trench filling 130, which connection 220 is disposed in a contact trench 205 having an upper region 215 and a lower region 210. The lower region 210 of the contact trench 205 is lined with an insulation collar 235 and at the same time surrounds a conductive material 225 disposed on the conductive trench filling 130. A conductive cap 230 is disposed above the insulation collar 235 and the conductive material 225 in the contact trench 205.

The conductive material 225 and the conductive cap 230 are composed of doped polysilicon, for example. The insulation collar 235 is composed of silicon oxide, for example.

An epitaxial layer 245 is situated above the insulating covering layer 135 and the substrate 105. The transistor 160 is formed in the epitaxial layer 245. The transistor 160 includes a drain region 165 connected to the conductive cap 230. Furthermore, the transistor 160 includes a source region 170 and a channel 175, which are likewise formed in the epitaxial layer 245. The source region 170 and the drain region 165 are formed from doped silicon, for example.

Situated above the channel 175 of the transistor 160 is a first word line 180, which is lined by a first insulation encapsulation 185 composed of silicon nitride, for example. A trench isolation 250 is disposed above the trench 115, next to the contact trench 205. The trench isolation 250 is composed of silicon oxide in the exemplary embodiment. The position of the trench isolation 250 is explained in more detail with reference to FIG. 2. A second word line 190, which is lined by a second insulation encapsulation, runs above the trench isolation 250. A third word line 200 runs next to the first word line 180. A stop layer 240 is disposed above the word line and the source region 170, which layer is removed between the first and second word lines. The stop layer protects the region between the first word line 180 and the third word line 200.

An active region 270 is surrounded all around by the trench isolation 250 and is situated in the epitaxial layer 245.

Figure 2:
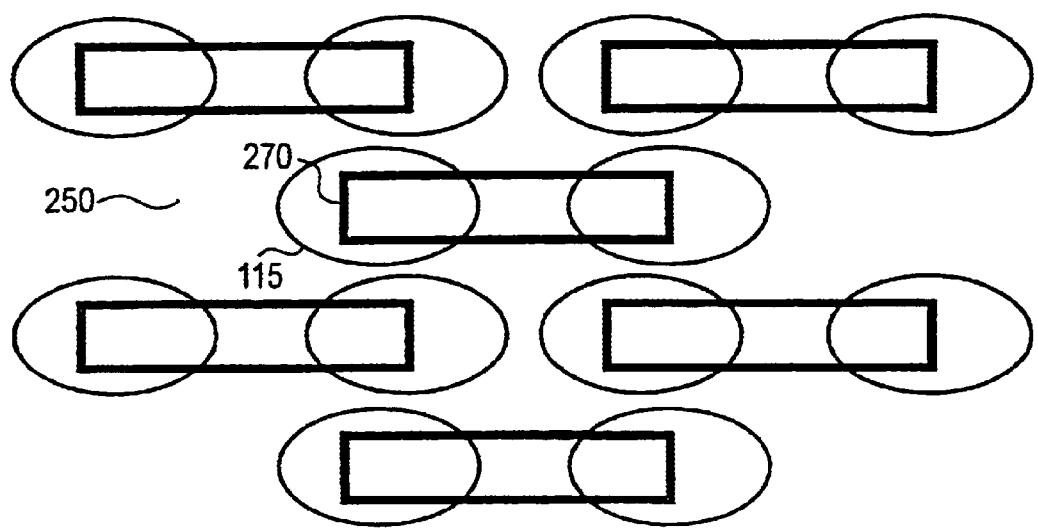
FIG. 2 is a diagrammatic plan view of a portion of a DRAM memory cell array with a memory cell according to FIG. 1.

FIG. 2 shows the plan view of the exemplary embodiment of the memory cell according to the invention that is shown in FIG. 1. The active region 270 is surrounded all around by the trench isolation 250. The trench 115 is situated at one end of the active region 270.

Figure 3:
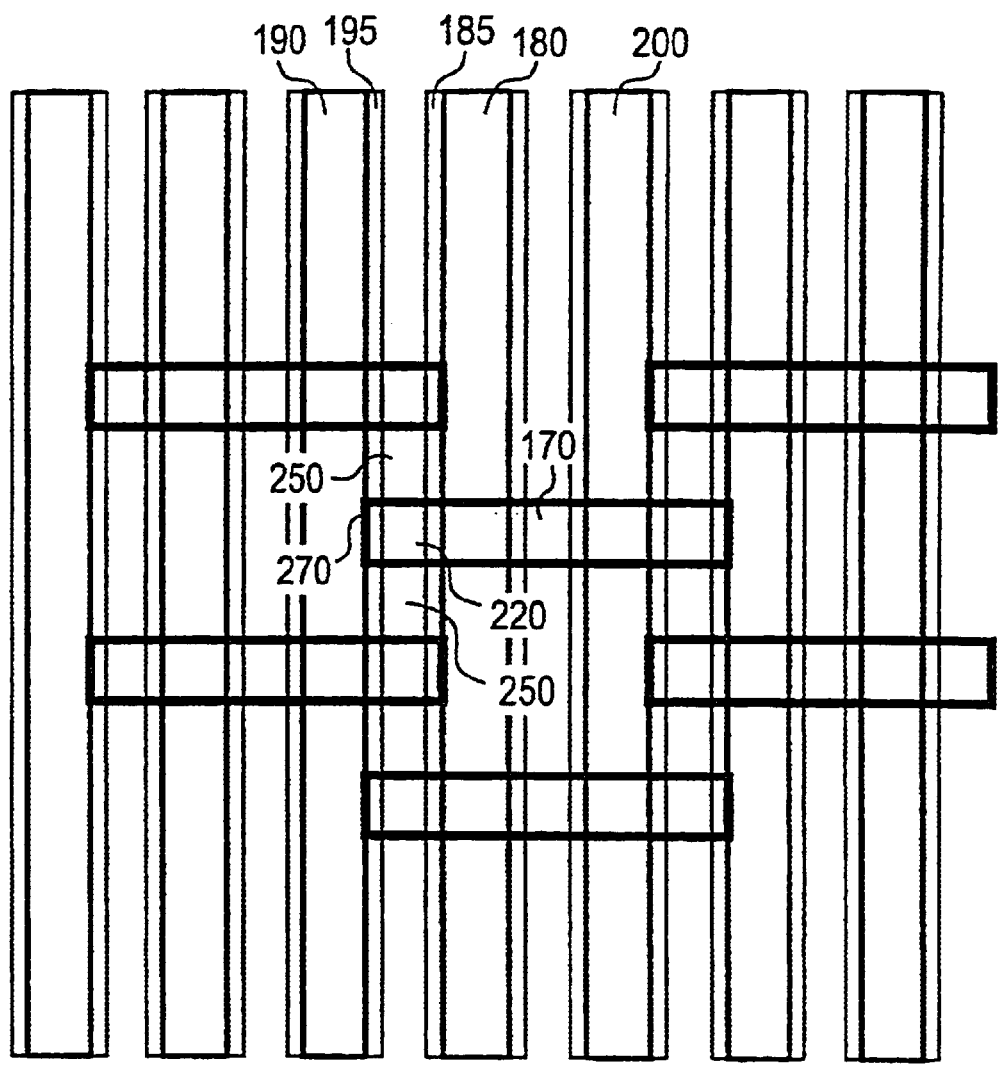
FIG. 3 is a diagrammatic plan view of another portion of the DRAM memory cell array with a memory cell according to FIG. 1.

FIG. 3 illustrates a further plan view of the memory cell illustrated in FIG. 1. For the sake of clarity, the trench 115 is not depicted, but is situated at the position shown in FIG. 2. In FIG. 3, the first word line 180 with its first insulation encapsulation 185 runs over the active region 270. The second word line 190 with its second insulation encapsulation runs over the trench isolation 250. The self-aligned connection 220 is bounded by the first word line 180 with first insulation encapsulation 185, by the second word line 190 with second insulation encapsulation 195 and by the trench isolation 250. In addition, the source region 170 is disposed between the trench isolation 250, the first word line 180, and the third word line 200.

Figure 4:
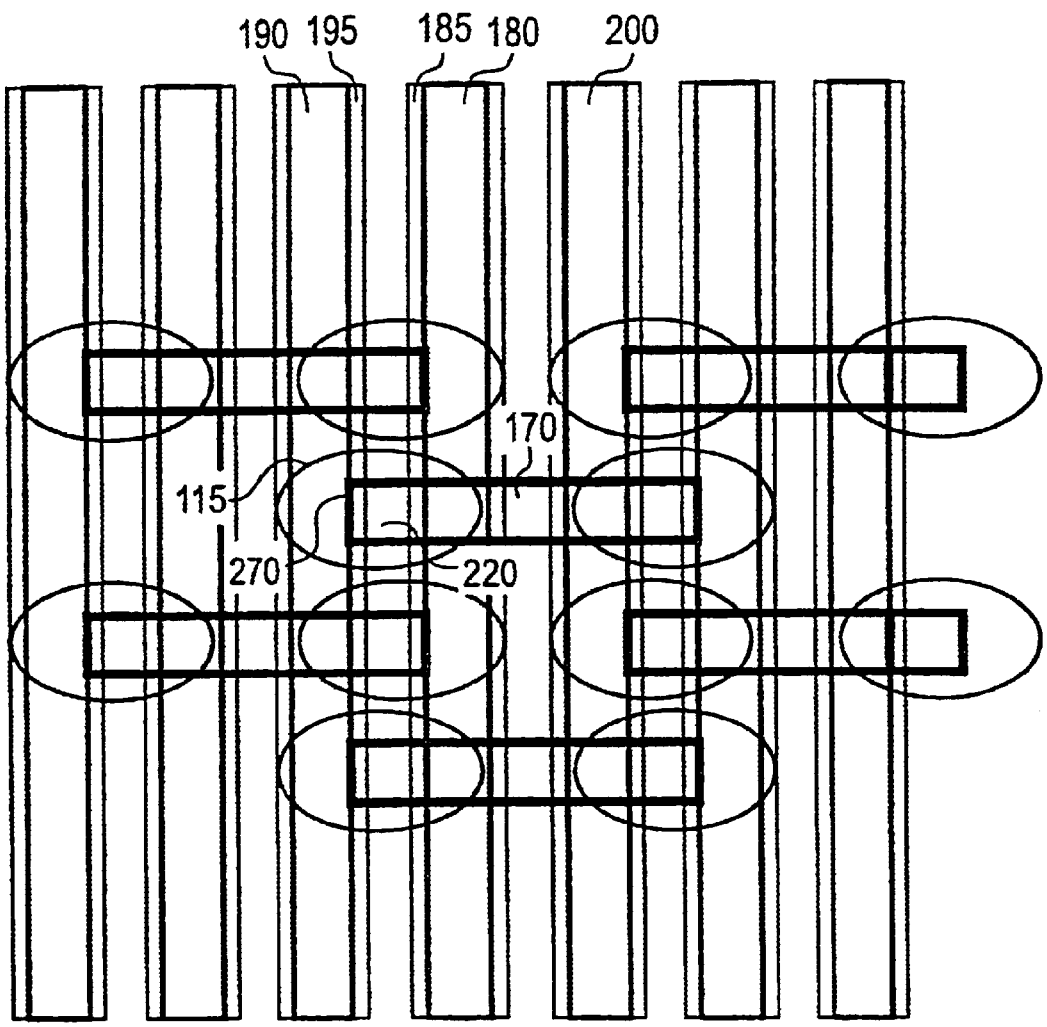
FIG. 4 is a diagrammatic plan view of a third portion of the DRAM memory cell array with a memory cell according to FIG. 1.

FIG. 4 illustrates a further plan view of the memory cell illustrated in FIG. 1. In contrast to FIG. 3, the position of the trench 115 is depicted.

Figure 5:
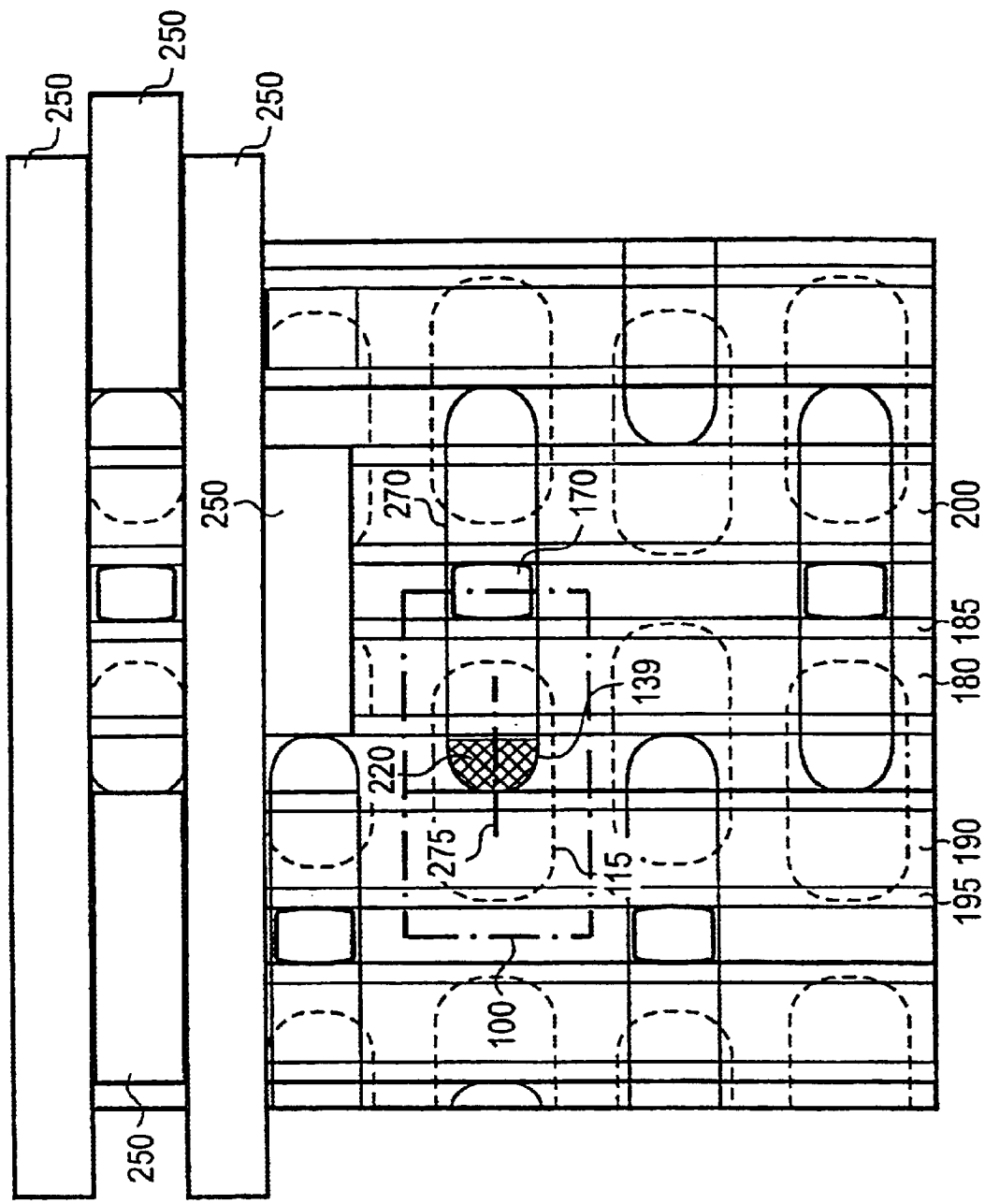
FIG. 5 is a diagrammatic plan view of a fourth portion of the DRAM memory cell array with a memory cell according to FIG. 1.

FIG. 5 shows a further plan view of the memory cell illustrated in FIG. 1. The size of the memory cell 100 is marked by a frame, which is an 8 $F^2$ cell, where F is the smallest lithographic dimension that can be attained. Within the frame marking of the memory cell 100, the trench 115 uses a large part of the substrate surface 106. In comparison with FIG. 4, the position of the epitaxial closing joint 275 is shown, which is formed on the insulating covering layer 135.

The transistor 160 controlled by the first word line 180 and an adjacent transistor controlled by the third word line 200 both use the common source region 170, which is disposed between these two word lines.

In the upper region of FIG. 5, for the sake of clarity, the trench isolation 250 is shown without word lines that run on the trench isolation 250.

The method for fabricating the memory cell according to the invention is explained with reference to FIGS. 1 to 5. The substrate 105 is provided, in and on which the DRAM memory cell is to be fabricated. In the variant shown, the substrate 105 is lightly doped with p-type dopants, such as boron, for example. An n-doped, buried well 155 is formed to a suitable depth in the substrate 105. By way of example, phosphorus or arsenic can be used as the dopant for doping the buried well 155. The buried well 155 may be produced by implantation, for example, and forms a conductive connection between the buried plates of the adjacent capacitors. As an alternative, the buried well 155 may be formed by epitaxially grown, doped silicon layers or by a combination of crystal growth (epitaxy) and implantation. Such a technique is described in U.S. Pat. No. 5,250,829 to Bronner et al.

The trench 115 is formed using a suitable hard mask layer as an etching mask for a reactive ion etching step (RIE). The large insulation collar 150, which is composed of silicon oxide, for example, is subsequently formed in the upper region 120 of the trench 115. The buried plate 145 is subsequently formed with n-type dopants, such as arsenic or phosphorus for example, as the outer capacitor electrode. The large insulation collar 150 serves as a doping mask that restricts the doping to the lower region 125 of the trench 108. Vapor phase doping, plasma doping, or plasma immersion ion implantation (PIII) can be used to form the buried plate 145. These techniques are described for example in Ransom et al., J. Electrochemical. Soc., Volume 141, No. 5 (1994), page 1378 et seq.; U.S. Pat. No. 5,344,381 to Cabrera and U.S. Pat. No. 4,937,205 to Nakayama et al. Ion implantation using the large insulation collar 150 as a doping mask is likewise possible. As an alternative, the buried plate 145 can be formed using a doped silicate glass as a dopant source, such as arsenic silicate glass (ASG), for example. This variant is described, for example, in Becker et al., J. Electrochemical. Soc., Volume 136 (1989), page 3033 et seq. If doped silicate glass is used for doping, then it is removed after the formation of the buried plate 145.

A dielectric layer 140 is subsequently formed, which layer lines the lower region 125 of the trench 115. The dielectric layer 140 serves as a storage dielectric for separating the capacitor electrodes. The dielectric layer 140 includes, for example, a silicon oxide, a silicon nitride, a silicon oxynitride, or a layer stack made of silicon oxide and silicon nitride layers. Materials having a high dielectric content, such as tantalum oxide or BST, for example, can also be used.

The conductive trench filling 130, which may be composed of doped polysilicon or amorphous silicon, for example, is subsequently deposited to fill the trench 115. By way of example, CVD or other prior art process techniques can be used for such a purpose.

The insulating covering layer 135 is formed on the conductive trench filling 130. This can be carried out, for example, by thermal oxidation of the conductive trench filling 130. It is also possible to deposit the insulating covering layer 135 onto the conductive trench filling 130. By way of example, CVD deposition methods can be used for this purpose. It is particularly advantageous to form the insulating covering layer 135 selectively on the conductive trench filling 130. The formation of the insulating covering layer 135 can be carried out selectively because, at this point in time, the hard mask layer used for etching the trench 115 is present on the substrate surface and, thus, only leaves free the region in which the insulating covering layer 135 is to be formed.

All layers situated on the surface 106 of the substrate 105 at this point in time are removed and the substrate 105 is cleaned. Afterward, the epitaxial layer 245 is grown epitaxially and selectively on the substrate 105. During the growth of the epitaxial layer 245, the insulating covering layer 135 is overgrown with monocrystalline silicon. The insulating covering layer 135 is overgrown with monocrystalline silicon from all directions, as illustrated in FIG. 5. The epitaxial closing joint 275 is produced in the process.

The selective epitaxial growth is described for example in the publication by N.C.C. Lou, IEDM 1988, page 588 et seq., where there is the problem, however, that an epitaxial layer is grown in two steps with interruption of the epitaxy. During the interruption, process steps such as the etching of a window into an oxide layer are carried out. Etching damage occurs in the process and increases the defect risk for the epitaxial layer and leads to leakage currents. An additional difficulty lies in the performance of the second epitaxy step, in which growth is effected both on monocrystalline silicon and on polysilicon. Such growth leads to crystal defects that propagate from the polycrystalline region into the monocrystalline region. The crystal defects are produced because the epitaxy is carried out both on monocrystalline silicon and on polycrystalline silicon. Because, in the publication, the grown polycrystalline "neck" is a functional part of the memory cell construction, the crystal defects cannot be avoided. However, the disadvantage is resolved according to the invention by at least partly removing the epitaxial closing joint 275.

The grown epitaxial layer 245 is subsequently etched back and planarized using an etching-back method and a chemical mechanical polishing (CMP) method, respectively.

The trench isolation 250 is subsequently formed. For such a purpose, the regions of the trench isolation that are marked in FIG. 2 are etched and filled with a dielectric material such as silicon oxide, for example, and subsequently planarized. The active region 270 remains for the subsequent formation of the transistor 160. The trench isolation 250 is preferably fabricated such that part of the epitaxial closing joint 275 is removed.

After the fabrication of the gate oxide, a doped polysilicon layer is deposited, from which the word lines are formed in a subsequent exposure and etching step. The first word line 180 is formed on the active region 270 and the second word line 190 is formed on the trench isolation 250. The first word line 180 is surrounded by a first insulation encapsulation 185, while the second word line 190 is surrounded by a second insulation encapsulation 195. The insulation encapsulations are composed of silicon nitride, for example.

The drain region 165 and the source region 170 are subsequently formed by ion implantation. The word lines formed from polysilicon together with their insulation encapsulations serve as implantation mask. Because the first word line 180 is disposed such that it partly runs perpendicularly above the insulating covering layer 135, part of the channel 175 of the transistor 160 is situated directly above the insulating covering layer 135. As a result, the transistor 160 is formed as a partial SOI transistor.

The stop layer 240 is subsequently deposited conformally, with the result that it covers the insulation encapsulations of the word lines. The stop layer 240 is formed from silicon nitride, for example. Afterward, an oxide layer is deposited and planarized back as far as the stop layer 240, thereby forming, for example, the insulation filling 280 between the first word line 180 and the third word line 200. A window is subsequently opened in the stop layer 240 by photolithography and etching. As such, the stop layer 240 is removed between the first word line 180 and the second word line 190, above the drain region 165. By anisotropic plasma etching that is selective with respect to the trench isolation 250, composed of silicon oxide, and selective with respect to the first insulation encapsulation 185 and the second insulation encapsulation 195, composed of silicon nitride, the drain region 165 and the epitaxial layer 245 are etched down to the insulating covering layer 135. The etching stops on the insulating covering layer 135 due to its selectivity. In addition, the etching is self-aligned because it is bounded laterally by the insulation encapsulations of the word lines and by the trench isolation 250. The remainder of the epitaxial closing joint 275 that was produced is preferably removed in the course of this etching.

The uncovered part of the insulating covering layer 135 is subsequently removed by selective etching that selectively removes the insulating covering layer 135, composed of silicon oxide. The selectivity is with respect to the conductive trench filling 130, composed of doped polysilicon, with respect to the epitaxial layer 245, composed of silicon, and with respect to the first and second insulation encapsulations 185 and 195 and the stop layer 240, composed of silicon nitride.

An insulation collar 235 is then formed in the lower region 210 of the contact trench 205. For such a purpose, thermal oxidation is carried out and a silicon oxide layer is deposited, from which the insulation collar 235 is formed by anisotropic etching back (spacer technique). The conductive material 225 is subsequently formed in the insulation collar 235. The conductive material 225 is composed of doped polysilicon, for example, and can be deposited using a CVD method.

The insulation collar 235 is etched back selectively down to the depth of the drain region 165. After a cleaning step, the conductive cap 230 is deposited and, thus, makes contact with the drain region 165 and the conductive material 225. Consequently, the conductive trench filling 130 is electrically connected to the drain region 165 through the conductive material 225. In such a configuration, the conductive cap 230 and the conductive material 225 are insulated from the epitaxial layer 245 by the insulation collar 235. As a result, the trench capacitor cannot be discharged by leakage currents.

The method for fabricating a first variant of a memory with a self-aligned connection 220 is, thus, explained and the subsequent process steps serve to complete the memory with the functional elements known from the prior art in a customary manner.

Figure 6:
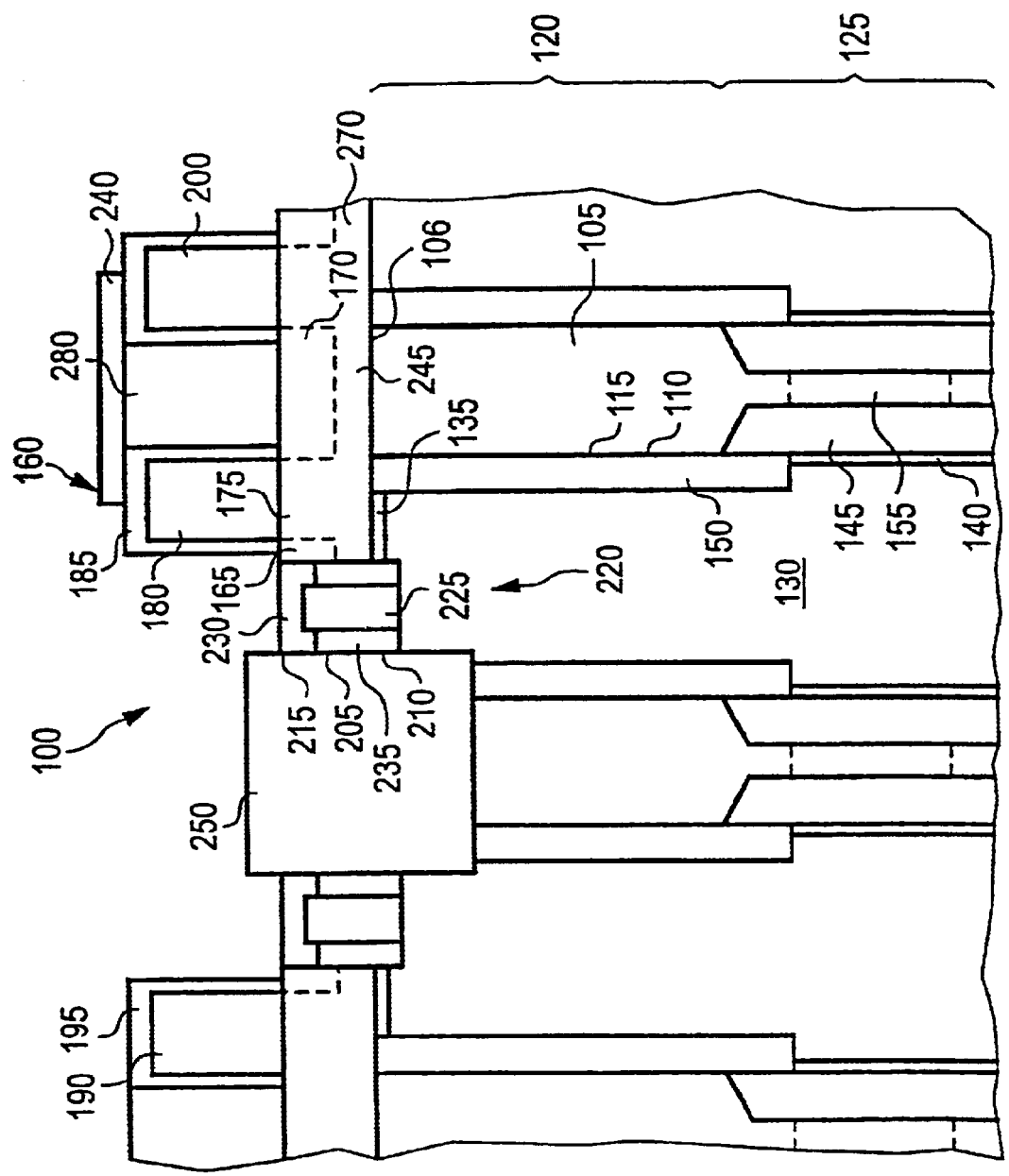
FIG. 6 is a fragmentary, cross-sectional view of a second embodiment of a DRAM memory cell according the invention.

FIG. 6 illustrates a further variant of a memory with a self-aligned connection. The memory of FIG. 6 is a one-transistor memory cell configuration having a 4F² cell layout having an open bit line architecture, having a trench capacitor and a partial SOI transistor. The memory cell 100 illustrated includes a trench capacitor 110 and a transistor 160. The trench capacitor 110 is formed in and on a substrate 105. A buried well 155, which is composed of n-doped silicon, for example, is introduced in the substrate 105. The trench capacitor 110 has a trench 115 having an upper region 120 and a lower region 125. A large insulation collar 150 is situated in the upper region 120 of the trench 115. The lower region 125 of the trench 115 at least partly penetrates the buried well 155. A buried plate 145 is disposed around the lower region 125 of the trench 115, which plate forms the outer capacitor electrode. The buried well 155 electrically connects the buried plates 145 of the adjacent memory cells to one another.

The lower region 125 of the trench 115 is lined with a dielectric layer 140, which forms the storage dielectric of the trench capacitor. The dielectric layer 140 may be fabricated from layers or layer stacks including silicon oxide, silicon nitride, or silicon oxynitride. The trench 115 is filled with a conductive trench filling 130, which forms the inner capacitor electrode. The insulating covering layer 135 is situated above the conductive trench filling 130, within the large insulation collar 150.

The epitaxial layer 245 is situated on the insulating covering layer 135, on the large insulation collar 150, and on the substrate 105. The transistor 160 is formed in the epitaxial layer 245 and includes a source region 170, a drain region 165, and a channel 175. Furthermore, the transistor 160 includes a first word line 180, which controls the channel 175. The first word line 180 is lined with a first insulation encapsulation 185, composed of silicon nitride, for example. The drain region 165 is electrically connected to the conductive trench filling 130 by a self-aligned connection 220. The self-aligned connection 220 includes an insulation collar 235, a conductive material 225 situated within the insulation collar 235 and a conductive cap 230, which connects the conductive material 225 to the drain region 165. The insulation collar 235 is disposed such that no leakage currents flow from the conductive trench filling 130, from the conductive material 225, or from the conductive cap 230 to the epitaxial layer 245.

The trench isolation 250 is situated between adjacent memory cells to electrically insulate the memory cells from one another. The course of the trench isolation 250 is described in more detail with reference to FIG. 8.

Figure 7:
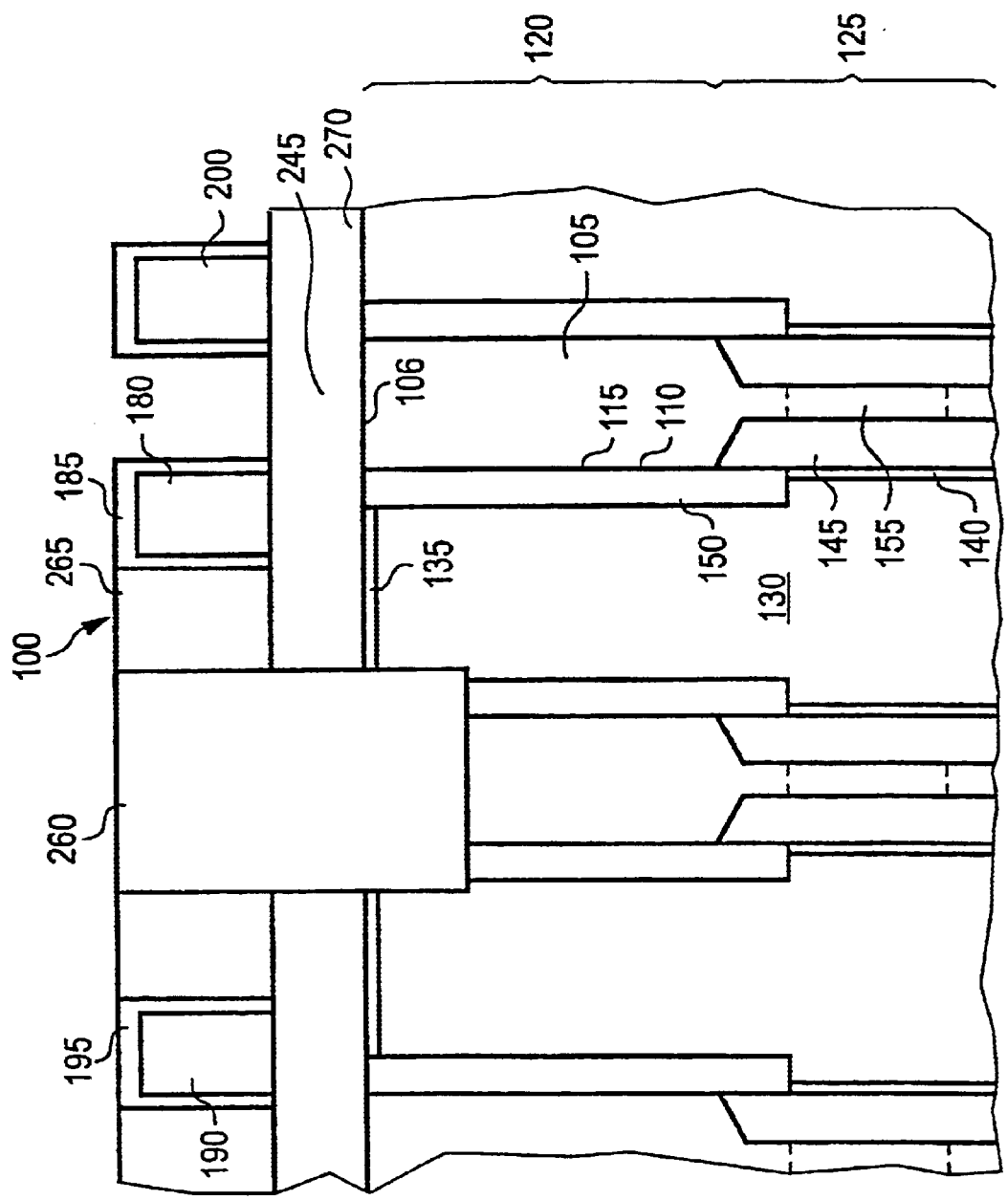
FIG. 7 is a fragmentary, cross-sectional view of an earlier process stage of the second embodiment according to FIG. 6.

FIG. 7 illustrates the cell configuration according to FIG. 6 at an earlier process stage. The trench isolation 250 illustrated is a second trench isolation 260 running in the word line direction. Sacrificial spacer webs 265, composed of silicon oxide, for example, are disposed on both sides of the trench isolation 260, which does not terminate with the surface of the epitaxial layer 245.

Figure 8:
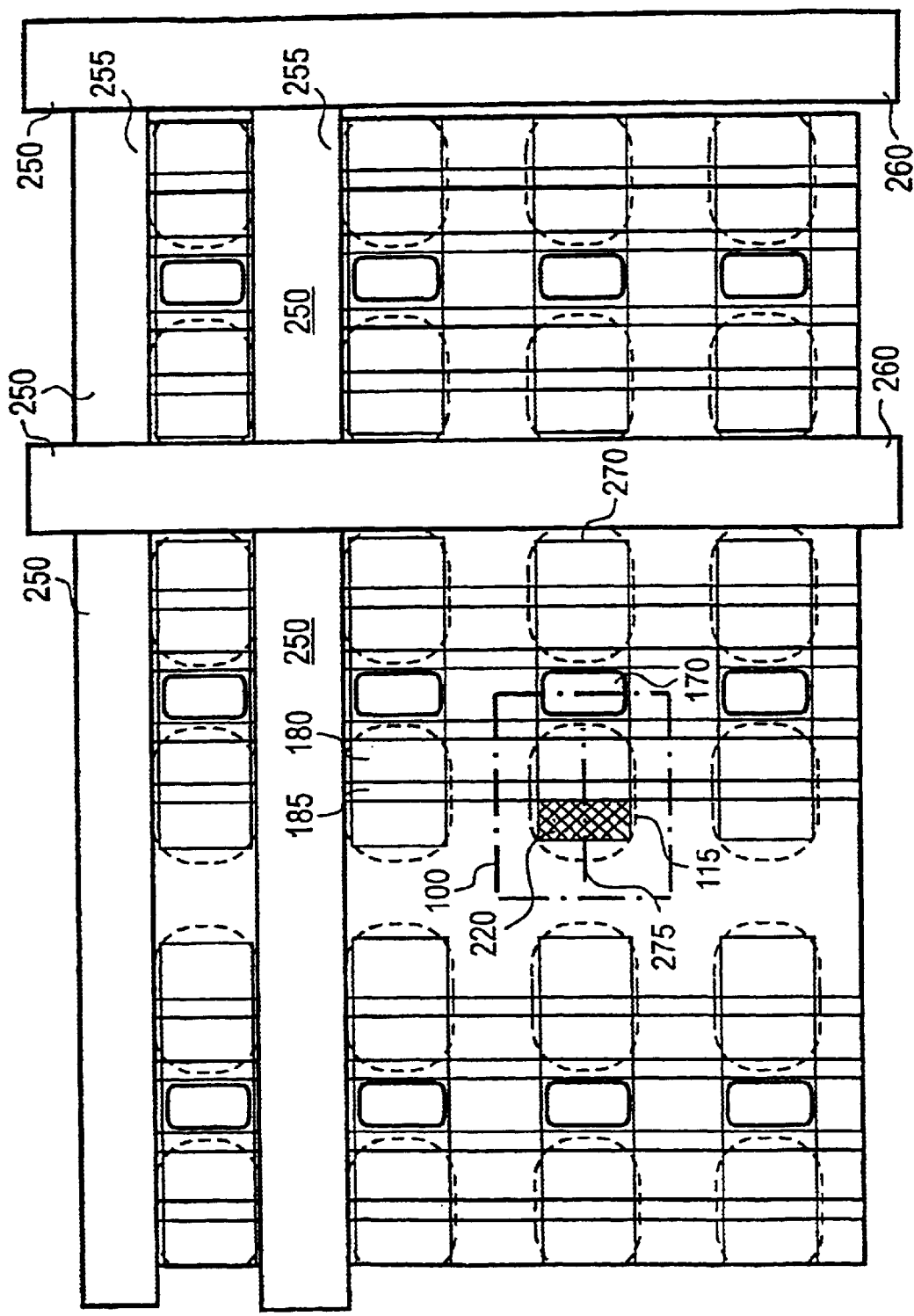
FIG. 8 is a plan view of a DRAM memory cell array according to FIG. 6.

FIG. 8 illustrates the memory cell configuration according to FIG. 6 in plan view. The size of the memory cell 100 is 4F² in the exemplary embodiment. The memory cell 100 includes, inter alia, the trench 115 in which the trench capacitor 110 is situated. The first word line 180, which is surrounded by the first insulation encapsulation 185, runs across the trench 115. Disposed on one side of the first word line is the source region 170 and on the other side the drain region 165 and the self-aligned connection 220 in the contact trench 205. The trench isolation 250 runs between adjacent memory cells. The active region 270 is used for the processing of the transistors. In the exemplary embodiment, the trench isolation 250 includes a first trench isolation 255 running parallel to bit lines and it includes a second trench isolation 260 running parallel to the word lines.

An epitaxial closing joint 275 is situated in the epitaxial layer 245, centrally above the trench 115.

The fabrication of the memory according to FIG. 6 will now be described with reference to FIG. 7. The fabrication of the memory cell configuration according to the invention begins with the realization of the trench capacitor 110 in a 4F² layout. First, the trench 115 is etched into the substrate 105. The large insulation collar 150 is formed in the upper region 120 of the trench 115. The lower region around the trench 115 is then doped so as to form the buried plate 145. In the lower region 125 of the trench 115, the dielectric layer 140 is subsequently formed, the trench is filled with the conductive trench filling 130 and the buried well 155 is formed by the introduction of dopant. Afterward, the conductive trench filling 130 is oxidized by thermal oxidation and the insulating covering layer 135 forms over the opening of the trench 115. This is done in a self-aligned manner because, at this point in time, a hard mask that was used to pattern the trench 115 cover the remainder of the substrate surface.

The hard mask is subsequently removed, with the result that the surface 106 of the substrate 105 at this point in time is formed from the insulating covering layer 135, the large insulation collar 150, and the substrate 105. After the oxidation of a screen oxide layer, the buried well 155 is formed by the implantation of dopant. The buried well 155 connects the buried plates of the adjacent memory cells.

After the removal of the screen oxide layer, the substrate surface 106 is cleaned and the epitaxial layer 245 is grown selectively. The growth of the epitaxial layer 245 begins on the uncovered substrate 105 and completely grows over the trench 115 laterally from all directions, the trench 115 being closed off by the insulating covering layer 135. An epitaxial closing joint 275 forms over the center of the insulating covering layer 135.

The trench isolation 250 is subsequently fabricated in two separate steps. First of all, the first trench isolation 255 running in the bit line direction is fabricated by a conventional technique such that it terminates in a planar manner with the epitaxial layer 245 on the surface thereof.

The second trench isolation 260 is subsequently formed in the word line direction. To that end, a relatively thick mask stack is patterned and transferred by selective plasma etching to the epitaxial layer 245 and the substrate 105. The patterned trenches are subsequently filled with silicon oxide and etched back in a planar manner as far as the surface of the mask stack. The mask stack is subsequently removed selectively to leave the second trench isolation 260 shown in FIG. 7. The trench capacitor 110 is overlapped by the second trench isolation 260 to a point underneath the insulating covering layer 135 and the epitaxial layer 245 is removed in this region. Sacrificial spacer webs 265 made of silicon oxide are subsequently formed on the side walls of the second trench isolation 260. The first word line 180 with its first insulation encapsulation 185 is subsequently produced as a lateral edge web (spacer) on the spacer web 265. The production is done by isotropic layer deposition and anisotropic selective etching back (spacer technique).

The first word line 180 is formed perpendicularly above the insulating covering layer 135, with the result that the transistor 160 is formed as a partial SOI transistor. The source region 170 is subsequently formed by implantation. The gap between the first word line 180 and the third word line 200, that is situated above the source region 170, is filled with an insulation filling 280. The second word line 190 is formed parallel to the first word line on an adjacent structure of the second trench isolation 260.

Afterward, the superficially uncovered word lines 180, 190, and 200 are selectively etched back and the trenches produced by etching-back are filled with an insulation made of silicon nitride by layer deposition and planarization to complete the first and second insulation encapsulations 185 and 195.

With reference to FIG. 6, in a subsequent photolithographic step, the sacrificial spacer web 265 is uncovered and etched back selectively as far as the surface of the epitaxial layer 245 by plasma etching. The region in which the source region 170 is situated is masked. On account of a lower etching rate, the second trench isolation 260 is partly etched back at the same time. The drain region 165 is subsequently formed by implantation of dopant.

The self-aligned connection 220 is formed between the first trench isolation 255, the second trench isolation 260 and the first insulation encapsulation 185 of the first word line 180. The formation of the self-aligned connection 220 is done by using structures that are already present, and for this reason, is referred to as self-aligned. The region in which the source region 170 is situated is masked with the stop layer 240.

To that end, anisotropic etching is used to etch the contact trench 205, which removes part of the drain region 165 and of the epitaxial layer 245 in this region. The selective etching stops on the insulating covering layer 135, composed of silicon oxide. The epitaxial closing joint 275 is removed by the etching of the contact trench 205.

The insulating covering layer 135 is removed at the bottom of the contact trench 205. This etching step is carried out selectively with respect to the first insulation encapsulation 185 and the trench isolation 250. The insulation collar 235 is subsequently formed by oxidation, silicon oxide deposition, and anisotropic etching back (spacer technique). The conductive material 225 made of doped polysilicon is then deposited in the insulation collar 235.

The insulation collar 235 is subsequently etched back as far as the level of the drain region 165. After a cleaning step, the conductive cap 230 is deposited. The conductive cap 230 is formed from doped polysilicon in the exemplary embodiment. As a result, the conductive trench filling 130 is electrically connected to the drain region 165 through the conductive material 225 and the conductive cap 230. Furthermore, the insulation collar 235 is formed such that neither the conductive trench filling 130, the conductive material 225, nor the conductive cap 230 have electrical contact with the epitaxial layer 245. The configuration prevents leakage currents that could discharge the trench capacitor 110.

The above steps conclude the formation of the self-aligned connection 220, and the memory cell configuration is completed with the remaining functional elements, as is known from the prior art.

We claim:

1. A semiconductor memory, comprising:
   a substrate;
   at least two memory cells, each of said memory cells disposed at least partly in said substrate and each of said memory cells having:
      a transistor having:
         a drain region;
         a source region; and
         a channel;
      a first word line disposed between said source region and said drain region;
      a trench capacitor having:
         an inner electrode;
         an outer electrode; and
         a dielectric layer disposed between said inner electrode and said outer electrode;
      a trench disposed in said substrate and filled with a conductive trench filling forming said inner electrode of said trench capacitor;
      an insulating covering layer disposed on said conductive trench filling;
      an epitaxial layer disposed on said substrate and at least partly on said insulating covering layer;
      said source region, said drain region, and said channel of said transistor disposed in said epitaxial layer;
      a trench isolation disposed in said substrate and in said epitaxial layer, said trench isolation insulating adjacent ones of said memory cells from one another, said trench isolation respectively extending into said inner electrode of each of two adjacent ones of said memory cells;
      said first word line disposed on said epitaxial layer and partly covering said trench;
      a first insulation encapsulation surrounding said first word line;
      a second word line disposed on said trench isolation;
      a second insulation encapsulation surrounding said second word line;
      a contact trench having a self-aligned connection electrically connecting said conductive trench filling to said drain region, said contact trench disposed between said first word line with said first insulation encapsulation and said second word line with said second insulation encapsulation; and
      said trench isolation bounding said contact trench.

2. The semiconductor memory according to claim 1, wherein:
   said contact trench has a lower region; and
   an insulation collar is disposed in said lower region.

3. The semiconductor memory according to claim 2, including a conductive material disposed in said insulation collar, in said contact trench, and on said conductive trench filling.

4. The semiconductor memory according to claim 3, including a conductive cap disposed on said conductive material in said contact trench.

5. The semiconductor memory according to claim 4, wherein:
   said insulation collar extends from said insulating covering layer at least as far as said drain region; and
   said conductive material and said conductive cap are not directly connected to said substrate or to said epitaxial layer.

6. The semiconductor memory according to claim 1, including a conductive material disposed on said conductive trench filling.

7. The semiconductor memory according to claim 6, wherein:
   said conductive material is disposed in said contact trench; and
   a conductive cap is disposed on said conductive material in said contact trench.

8. The semiconductor memory according to claim 6, wherein:
   said insulation collar extends from said insulating covering layer at least as far as said drain region; and
   said conductive material and said conductive cap are not directly connected to said substrate or to said epitaxial layer.

9. The semiconductor memory according to claim 1, wherein said trench isolation extends deeper into said substrate than a depth of said insulating covering layer.

10. A method for forming a semiconductor memory, which comprises:
   providing a substrate having:
      a surface;
      a trench; and
      memory cells each having:
         a transistor with a drain region, a source region, and a channel;
         a first word line disposed between the source region and the drain region; and
         a trench capacitor having an inner electrode, an outer electrode, and a dielectric layer disposed between the inner electrode and the outer electrode;
   filling the trench with a conductive trench filling to form the inner electrode of the trench capacitor;
   forming an insulating covering layer on the conductive trench filling;
   growing an epitaxial layer on the surface of the substrate and partly covering the insulating covering layer with the epitaxial layer;
   forming a trench isolation to insulate adjacent memory cells from one another;
   forming the first word line above the epitaxial layer;
   forming a second word line above the trench isolation;
   surrounding the first word line a first insulation encapsulation;
   surrounding the second word line a second insulation encapsulation;
   defining the source region and the drain region of the transistor in the epitaxial layer;
   etching a contact trench through the epitaxial layer and the insulating covering layer as far as the conductive trench filling utilizing the first word line with the first insulation encapsulation and the second word line with the second insulation encapsulation as an etching mask for the etching of the contact trench; and
   forming a connection in the contact trench to electrically connect the conductive trench filling to the drain region.

11. The method according to claim 10, which further comprises utilizing the trench isolation as an etching mask for a self-aligned formation of the contact trench.

12. The method according to claim 11, which further comprises forming an insulation collar in a lower region of the contact trench.

13. The method according to claim 12, which further comprises introducing at least one conductive material in the contact trench.

14. The method according to claim 13, which further comprises forming a conductive cap in the contact trench above the conductive material and above the insulation collar.

15. The method according to claim 14, which further comprises forming the insulation collar to electrically connect the conductive material and the conductive cap to the epitaxial layer only through the drain region.

16. The method according to claim 11, which further comprises introducing at least one conductive material in the contact trench.

17. The method according to claim 10, which further comprises forming the contact trench in a self-aligned manner utilizing the trench isolation as an etching mask.

18. The method according to claim 10, which further comprises carrying out a temperature step after growing the epitaxial layer.

19. The method according to claim 10, which further comprises annealing the epitaxial layer after growing the epitaxial layer.

20. The method according to claim 10, which further comprises planarizing the epitaxial layer after growing the epitaxial layer.

21. The method according to claim 10, which further comprises doping the epitaxial layer in situ while growing the epitaxial layer.

22. The method according to claim 10, which further comprises forming an insulation collar in a lower region of the contact trench.

23. The method according to claim 10, which further comprises introducing at least one conductive material in the contact trench.

24. The method according to claim 10, which further comprises forming a conductive cap in the contact trench.

* * * * *